(12) United States Patent
Narisawa

(10) Patent No.: US 8,692,347 B2
(45) Date of Patent: Apr. 8, 2014

(54) SOLID-STATE IMAGING DEVICE AND METHOD OF MANUFACTURING SOLID-STATE IMAGING DEVICE

(75) Inventor: Sosuke Narisawa, Tokyo (JP)

(73) Assignee: Sony Corporation, Tokyo (JP)

(*) Notice: Subject to any disclaimer, the term of this patent is extended or adjusted under 35 U.S.C. 154(b) by 150 days.

(21) Appl. No.: 13/200,938

(22) Filed: Oct. 5, 2011

(65) Prior Publication Data

US 2012/0139018 A1 Jun. 7, 2012

(30) Foreign Application Priority Data

Dec. 2, 2010 (JP) ................................. 2010-269176

(51) Int. Cl.
*H01L 27/14* (2006.01)

(52) U.S. Cl.
USPC .... 257/445; 257/461; 257/462; 257/E31.093; 257/E31.032

(58) Field of Classification Search
USPC .................. 257/444, 445, 461, 462, E31.093, 257/31.032 E
See application file for complete search history.

(56) References Cited

U.S. PATENT DOCUMENTS

| 5,404,039 | A | * | 4/1995 | Watanabe | 257/230 |
|---|---|---|---|---|---|
| 5,898,195 | A | * | 4/1999 | Harada | 257/223 |
| 7,453,130 | B2 | * | 11/2008 | Nakai | 257/432 |
| 7,541,571 | B2 | * | 6/2009 | Lee | 250/214.1 |
| 7,586,172 | B2 | * | 9/2009 | Roy | 257/462 |
| 7,642,614 | B2 | * | 1/2010 | Hirata | 257/446 |
| 8,115,268 | B2 | * | 2/2012 | Hirata | 257/446 |
| 8,174,603 | B2 | * | 5/2012 | Krymski | 348/308 |
| 8,395,194 | B2 | * | 3/2013 | Yokoyama et al. | 257/230 |
| 2009/0273696 | A1 | * | 11/2009 | Krymski | 348/302 |
| 2011/0183709 | A1 | * | 7/2011 | Roy | 455/556.1 |
| 2012/0139018 | A1 | * | 6/2012 | Narisawa | 257/292 |

FOREIGN PATENT DOCUMENTS

JP 2006-228762 A 8/2006

* cited by examiner

*Primary Examiner* — Michael Shingleton
(74) *Attorney, Agent, or Firm* — Sony Corporation

(57) ABSTRACT

A solid-state imaging device includes: a gate electrode arranged over an upper surface of a semiconductor substrate; a photoelectric conversion portion formed over the semiconductor substrate to position under the gate electrode; an overflow barrier formed over the semiconductor substrate to position in a portion other than a position facing the gate electrode in a planar direction and adjoin a side face of the photoelectric conversion portion; and a drain formed over the semiconductor substrate to adjoin a side face of the overflow barrier opposite to a side face adjoining the photoelectric conversion portion.

20 Claims, 9 Drawing Sheets

SOLID-STATE IMAGING DEVICE AND METHOD OF MANUFACTURING SOLID-STATE IMAGING DEVICE

FIELD

The present disclosure relates to a solid-state imaging device, and particularly, to a solid-state imaging device employing a charge modulation device in a pixel and a method of manufacturing the solid-state imaging device.

BACKGROUND

Charge coupled device (CCD) or complementary metal oxide semiconductor (CMOS) sensors and the like are practically used as a solid-state imaging device. In such a solid-state imaging device, a plurality of pixels are arranged in a matrix shape.

In a portion of the semiconductor substrate layer corresponding to a single pixel, a predetermined number of portions using an impurity diffusion layer are arranged in appropriate positions. As the CCD, a structure in which an impurity diffusion layer that forms a perpendicular transmission portion is arranged under a transmission electrode, and an impurity diffusion layer that forms a photoelectric conversion portion is arranged between the transmission electrodes is known (for example, refer to JP-A-2006-228762, FIG. 1). In this related art, the relative positions of the perpendicular transmission portion and the photoelectric conversion portion to the transmission electrode are accurately set through self-alignment.

Self-alignment refers to a process of forming the impurity diffusion layer with respect to the layer formed over the semiconductor substrate by performing ion implantation after a layer that blocks ions, such as an electrode layer or a cover layer, is formed over the semiconductor substrate in advance. Through self-alignment, it is possible to accurately determine a relative position between the impurity diffusion layers with respect to the edges of the layers formed over the semiconductor substrate.

SUMMARY

In addition to CCD and the CMOS, a charge modulation device (CMDi) is also known as the solid-state imaging device. In the CMD, a source and a drain are formed such that an electric current flows between the source and the drain in parallel with the surface of the semiconductor layer. Furthermore, a gate electrode is formed on the surface of the semiconductor layer between the source and the drain by interposing an insulation layer.

For example, in the CMD having such a construction, a photoelectric conversion function and a signal amplification function can be provided to each pixel. In addition, in the CMD, the electric charge generated by receiving light is maintained as long as it is not reset. The electric charge is not eliminated but is maintained as it is accumulated even when it is read as a signal. As a result, a so-called nondestructive reading can be achieved.

The drain of the CMD also serves as an overflow drain from which the electric charge accumulated in the photoelectric conversion portion is discharged. An overflow barrier is formed between the drain and the photoelectric conversion portion, and the overflow barrier is eliminated by applying a reset voltage to the drain when the electric charge accumulated in the photoelectric conversion portion of the CMD is reset. As a result, the electric charge is discharged from the photoelectric conversion portion to the overflow drain.

It is preferable that such a CMD is manufactured so that the relative positions of each portion in the semiconductor substrate are accurately determined through self-alignment. In this regard, if the manufacturing process for the pixel structure of the related art is directly applied to the manufacturing of the CMD, the gate electrode, the overflow barrier, the drain, and the like may be formed with accurate relative positions therebetween. However, since the manufacturing process of the related art has been designed originally for the CCD, the positional relationship between the gate electrode, the overflow barrier, the drain, and the like is not suitable for the CMD structure. For this reason, the present inventors have recognized some difficulties and problems in that it is difficult to sufficiently increase a modulation degree from the drain to the overflow barrier, and it is necessary to set a high reset voltage.

Thus, it is desirable to provide a CMD type solid-state imaging device in which a reset voltage can be lowered under the assumption that the relative position of the impurity diffusion layer is accurately set through self-alignment.

An embodiment of the present disclosure is directed to a solid-state imaging device including: a gate electrode arranged over an upper surface of a semiconductor substrate; a photoelectric conversion portion formed over the semiconductor substrate to position under the gate electrode; an overflow barrier formed over the semiconductor substrate to position in a portion other than a position facing the gate electrode in a planar direction and adjoin a side face of the photoelectric conversion portion; and a drain formed over the semiconductor substrate to adjoin a side face of the overflow barrier opposite to a side face adjoining the photoelectric conversion portion. As a result, compared to a case where the overflow barrier is positioned to face the gate electrode in a planar direction, it is possible to lower the coupling capacitance between the gate electrode and the overflow barrier as a factor for determining the modulation degree from the drain to the overflow barrier.

In this embodiment, a position of a border where the photoelectric conversion portion and the overflow barrier adjoin each other may match a position of an end of the gate electrode. As a result, it is possible to define the border position between the photoelectric conversion portion and the overflow barrier with respect to the end of the gate electrode.

In this embodiment, the solid-state imaging device may further include a sidewall portion arranged to adjoin an end of the gate electrode in the drain side. A position of a border where the overflow barrier and the drain adjoin each other may match a position of an end of the sidewall portion. As a result, it is possible to define the border position between the overflow barrier and the drain with respect to the end of the sidewall portion.

In this embodiment, the sidewall portion may be a part of a sidewall material layer remaining without being removed when a process of removing the sidewall material layer formed on a front surface of the semiconductor substrate where the gate electrode is arranged is performed. As a result, it is possible to form the sidewall portion through the process of removing the sidewall material layer.

In this embodiment, a width of the sidewall portion extending from an end adjoining the gate electrode to an opposite end may be set when a process of removing the sidewall material layer is performed. As a result, it is possible to adjust the width of the sidewall portion in the process of removing the sidewall material layer.

Another embodiment of the present disclosure is directed to a method of manufacturing a solid-state imaging device:

the method including: forming a first impurity diffusion layer corresponding to a photoelectric conversion portion by performing ion implantation to the semiconductor substrate; forming a gate electrode on an upper surface of the semiconductor substrate where the first impurity diffusion layer has been formed; forming a second impurity diffusion layer corresponding to an overflow barrier by performing ion plantation to the semiconductor substrate where the gate electrode has been formed; forming a sidewall material layer on the entire upper surface of the semiconductor substrate where the second impurity diffusion layer has been formed; forming a side wall portion as a part of the sidewall material layer remaining without being removed in an end of the gate electrode when a process of removing the sidewall material layer from the semiconductor substrate is performed; and forming a third impurity diffusion layer corresponding to a drain by performing ion implantation to the semiconductor substrate where the sidewall portion has been formed. As a result, it is possible to form the overflow barrier not to face the gate electrode in a planar direction through self-alignment with respect to each of the gate electrode and the sidewall portion.

According to the embodiments of the present disclosure, it is possible to provide a CMD type solid-state imaging device by which the relative position of the impurity diffusion layer can be accurately set through the self-alignment, and the reset voltage can be set to a lower value.

DETAILED DESCRIPTION

Hereinafter, embodiments of the present disclosure will be described in the following sequence.

1. First Embodiment: an exemplary CMD pixel having an overflow barrier formed in a position not facing a gate electrode
2. Modifications 1. First Embodiment

[Exemplary Configuration of Pixel]

The image sensor according to an embodiment of the present disclosure employs a charge modulation device (CMD) in the pixel. The CMD has a source region and a drain region formed to flow an electric current in parallel with a surface of a semiconductor layer. In addition, a gate is provided on the surface of the semiconductor layer between the source and drain regions by interposing an insulation layer. As a result, as a static induction transistor (SIT), a so-called trans-verse structure having gate, drain, and source regions transversely is provided.

Figure 1:
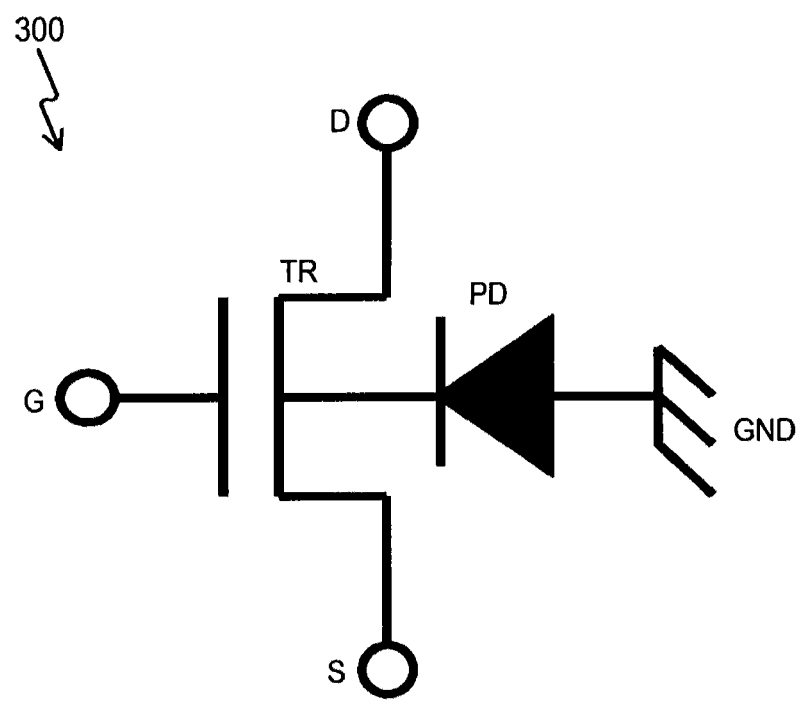
FIG. 1 is a diagram illustrating an equivalent circuit of a CMD type pixel according to an embodiment of the present disclosure.

FIG. 1 illustrates an equivalent circuit of the pixel 300 having a CMD structure as a pixel used to form the image sensor according to the embodiment of the present disclosure. Referring to FIG. 1, it is recognized that a single photodiode PD is connected in turn to a single transistor TR in the pixel 300. The photodiode PD is a portion for photoelectric conversion, and an electric current corresponding to a received light amount flows therethrough. In the photoelectric conversion of the CMD, the photodiode PD can be considered to be formed in the rear side of the transistor TR. Although the anode side is grounded in the drawing, in practice, it is connected to a well region, which is equivalent to the ground.

The transistor TR forms a source follower along with a load current source of the corresponding column signal line as described below. The transistor TR amplifies electric charge obtained from the photodiode PD and outputs the amplified electric charge to the corresponding column signal line.

The circuit shown in FIG. 1, the pixel 300 itself employing the CMD has a photoelectric conversion function and a signal amplification function. In addition, there is no floating diffusion in the pixel 300 of the configuration shown in FIG. 1. Floating diffusion refers to a portion to which the electric charge accumulated in the photodiode PD is transmitted in the pixel circuit. In the pixel 300 employing the CMD, the electric charge generated in the photodiode PD as light is received is accumulated and maintained as long as the pixel 300 is not reset, and the electric charge is not eliminated even when it is read as a signal. As a result, a so-called nondestructive reading can be achieved.

[Configuration of Image Sensor]

Figure 2:
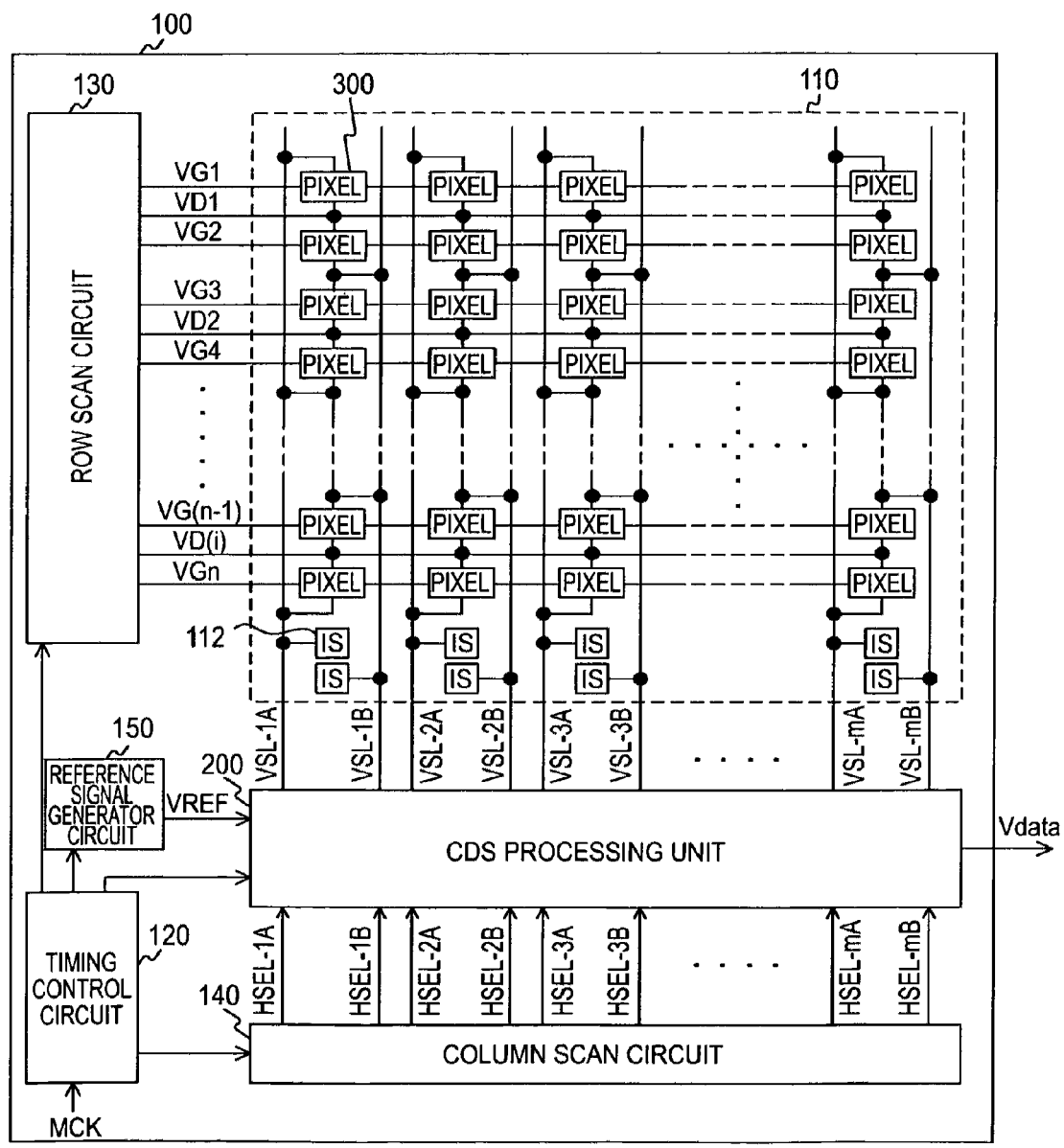
FIG. 2 is a diagram illustrating an exemplary circuit configuration of an image sensor according to an embodiment of the present disclosure.

Next, an exemplary configuration of the image sensor 100 according to the embodiment of the present disclosure will be described with reference to FIGS. 2 and 3. FIG. 2 illustrates a configuration of the entire image sensor 100, and FIG. 3 partially illustrates the pixels 300 of the first to sixth rows in the first column of the pixel array 110 of the image sensor 100 and a configuration of the CDS processing unit 200 corresponding to the first column.

First, as shown in FIG. 2, the image sensor 100 generally includes a pixel array 110, a timing control circuit 120, a row scan circuit 130, a column scan circuit 140, a reference signal generator circuit 150, and a CDS processing unit 200.

The pixel array 110 includes, for example, several millions or more of a predetermined number of pixels 300 arranged in a matrix shape in n rows and m columns. As shown in FIG. 3 too, each pixel 300 has the same CMS configuration as that of the equivalent circuit of FIG. 1.

In addition, although the pixel array 110 is formed on, for example, a single semiconductor substrate (chip), each of the portions, circuits, and the like other than the pixel array 110 shown in FIG. 2 is also formed integrally on the same semiconductor substrate as that of the pixel array 110.

The timing control circuit 120 generates a desired clock/timing signal and the like based on a master clock MCK input from an outer side of the image sensor 100. The clock/timing signal generated in this manner is output to corresponding portions in the image sensor 100 and is used to determine the operational timing of each portion.

The row scan circuit 130 includes a shift register, a decoder, and the like, and is used to sequentially scan the pixel array 110 on a row-by-row basis. Each row scan circuit 130 outputs row selection signals VG1 to VGn and reset signals VD1 to VDi at a predetermined timing corresponding to each horizontal scan period. As a result, each row is sequentially scanned in a predetermined order from the first row to the last row corresponding to one frame period. The aforementioned timing for outputting the signals from the row scan circuit 130 is set by the timing signal output from the timing control circuit 120.

Similar to the row scan circuit 130, the column scan circuit 140 includes a shift register, a decoder, and the like, and scans each corresponding column. The column scan circuit 140 outputs column control signals HSEL-1A and HSEL-1B to HSELm-A and HSELm-B at predetermined timings in response to controlling of the timing control circuit 120. Each of the column control signals HSEL-1A and HSEL-1B to HSELm-A and HSELm-B corresponds to, for example, each of the pixel signals VSL-1A and VSL-1B to VSL-mA and VSL-mB.

The reference signal generator circuit 150 generates a reference signal VREF having a ramp waveform of a predetermined inclination at a timing controlled by the timing control circuit 120, and outputs the reference signal VREF to the CDS processing unit 200.

Next, an embodiment of a connection between the pixel array 110 and the signal lines in the row and column directions will be described. As shown in FIG. 2, to the pixel 300 of the first row in the pixel array 110, the row signal line for the row selection signal VG1 output from the row scan circuit 130 is commonly connected. In turn, similarly, to pixels 300 of each of the second row to the (n)th row, the row signal lines of the row selection signals VG2 to VGn output from the row scan circuit 130 are commonly connected. In addition, the row signal line of the row selection signals VG1 to VGn is connected to, for example, the gate of the transistor TR in the pixel 300 of the corresponding row as shown in the pixels 300 of the first row to the sixth row in the first column in FIG. 3.

Each transistor TR of the pixels 300 of the first and second rows in the same column has a common connection point. This connection point serves as a drain connection point DCNT1 where the drains of the transistor TR of the pixels 300 of the first and second rows are commonly connected. To the drain connection point DCNT1, the row signal line of the reset signal VD1 output from the row scan circuit 130 is connected. Then, similarly, in each row starting from a pair of the third and fourth rows to a pair of the (n−1)th and (n)th rows, drain connection points DCNT2 to DCNTn/2 are provided, to which drains of the transistors TR of each pixel 300 are commonly connected. To the drain connection points DCNT2 to DCNTn/2, the row signal lines of the reset signals VD2 to VD (n/2) output from the row scan circuit 130 are connected respectively.

In the image sensor 100 according to the embodiment of the present disclosure, two column signal lines correspond to a single column. That is, as shown in FIG. 2, two column signal lines are provided for the pixel signals VSL-1A and VSL-1B correspondingly in the first column. Similarly, two column signal lines are provided respectively for the pixel signals VSL-2A and VSL-2B to pixel signals VSL-mA and VSL-mB correspondingly in the second to (m)th columns. As shown in FIG. 3, to each column signal line, the load current source (IS) 112 serving as a constant current source is connected.

More specifically, the column signal lines and the pixels 300 are connected as follows. That is, as shown in FIG. 3, first, in the transistor TR of the pixel 300 of the first row, only the source thereof is connected to the column signal line of the pixel signal VSL-1A. Next, the source connection point SCNT1 is provided by commonly connecting the sources of the transistors TR of the pixels 300 of the second and third rows, and the column signal line of the pixel signal VSL-1B is connected to the source connection point SCNT1. Similarly, the source connection point SCNT2 is provided by commonly connecting the sources of the transistors TR of the pixels 300 of the fourth and fifth rows, and the column signal line of the pixel signal VSL-1A is connected to the source connection point SCNT2. Furthermore, the source connection point SCNT3 is provided by commonly connecting the sources of the pixels 300 of the sixth and seventh rows (not shown), and the column signal line of the pixel signal VSL-1B is connected to the source connection point SCNT3. Similarly, in turn, the source connection points SCNT4, SCNT5, SCNT6, . . . , and the like are provided by connecting the sources of the transistors TR of the pixels 300 of neighboring two rows. Out of the source connection points SCNT4, SCNT5, SCNT6, . . . , and the like, the column signal line of the pixel signal VSL-1A is connected to the source connection points SCNT4, SCNT6, SCNT8, . . . , and the like, and the column signal line of the pixel signal VSL-1B is connected to the source connection point SCNT5, SCNT7, SCNT9, . . . , and the like. That is, the source connection points SCNT are alternately connected to each column signal line of the pixel signal VSL-1A and the pixel signal VSL-1B along the corresponding arrangement sequence in the column direction. Connection between the column signal line and the pixel 300 corresponding to the first column described in conjunction with FIG. 3 is similarly performed for the second column to the (m)th column.

As described above, connection between each pixel 300 and the column signal line corresponds to connection between the column signal line and the source of the transistor TR inside the pixel. The transistor TR of a single pixel 300, and the load current source 112 of the column signal line connected to the source of the transistor TR constitute a source follower. That is, the pixel signal VSL obtained by the column signal line corresponds to the output of the source follower of a single pixel 300 selected in the row direction out of the pixels 300 connected to the corresponding column signal line. In this configuration, it can be considered that a single transistor TR is shared for a charge transmission function, an amplification function, and a reset function.

The pixel signals VSL-1A and VSL-1B to VSL-mA and VSL-mB obtained for each column signal line are respectively input to the CDS processing unit 200. The CDS processing unit 200 receives the pixel signal VSL and performs a correlated double sampling (CDS) process so that the pixel signal is output to have a level corresponding to the signal component depending on the received light amount (received light component). The CDS processing unit 200 outputs the pixel signal as a digital signal through the CDS process. The pixel signal of the digital signal is output from the CDS processing unit 200 as imaging signal data Vdata. The imaging signal data Vdata is received, for example, by an image signal processing system (not shown), and is used in processing of components such as creation of the captured image data.

Figure 3:
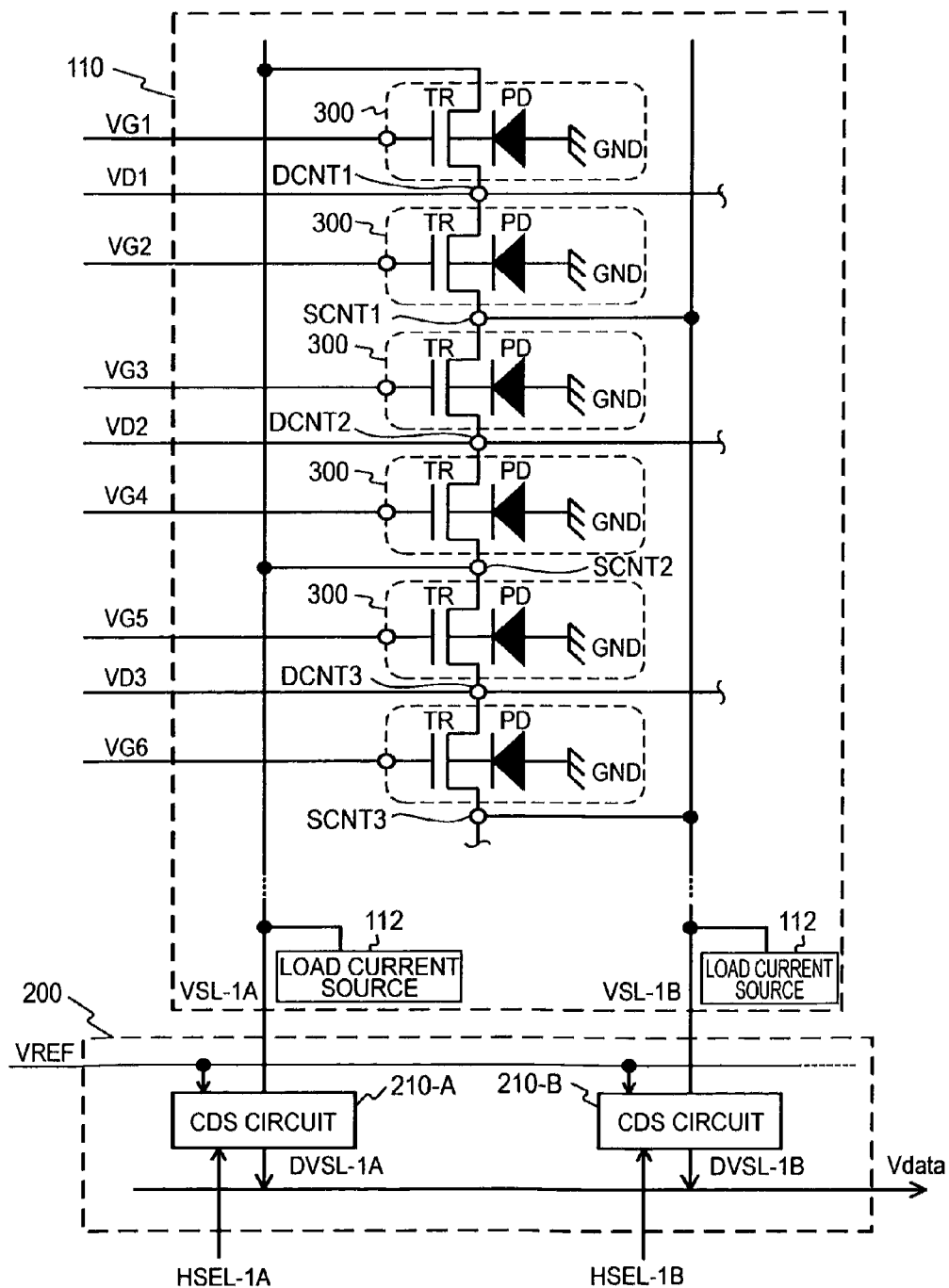
FIG. 3 is a diagram selectively illustrating a configuration of a single column of a pixel array according to an embodiment of the present disclosure.

In the CDS processing unit 200 according to the embodiment of the present disclosure, as shown in FIG. 3, CDS circuits 210-A and 210-B are provided in two column signal lines for a pair of two pixel signals VSL-1A and VSL-1B, respectively. The CDS circuit 210-A receives the pixel signal VSL-1A, performs A/D conversion through CDS processing, and outputs the pixel signal data DVSL-1A at the timing responding to the column control signal HSEL-1A. Similarly, the CDS circuit 210-B receives the pixel signal VSL-1B, performs A/D conversion, and outputs the pixel signal data DVSL-1B at the timing responding to the column control signal HSEL-1B.

According to the embodiment of the present disclosure, similarly, the CDS circuits 210-A and 210-B are correspondingly provided for each pair of the remaining column signal lines. Similarly, the CDS circuits 210-A and 210-B sequentially output the corresponding pixel signals VSL-2A and VSL-2B to VSL-mA and VSK-mB at the timing responding to the output of the column control signals HSEL2-A and HSEL2-B to HSELm-A and HSELm-B. The image signal data Vdata output from the CDS processing unit 200 contain the pixel signals VSL-1A and VSL-1B to VSL-mA and VSL-mB correspondingly output to each column signal line.

In the A/D conversion operation through the CDS processing, an A/D conversion period including a D-phase period and a P-phase period subsequent to the D-phase period is set, and this A/D conversion period is repeated. During the D-phase period, electric charge is accumulated in the photodiode. During the P-phase period, electric charge is not accumulated in the photodiode.

First, in the D-phase period, a level corresponding to the received light amount is exhibited in the pixel signal VSL. In the D-phase period, the CDS circuit 210 initiates counting after the pixel signal VSL and the reference signal VREF are set to the same voltage, and stops the counting when the magnitude relationship between the pixel signal VSL and the reference signal VREF having a ramp waveform is reversed. The count value obtained in this manner indicates a level of the pixel signal VSL obtained in the D-phase period.

When the D-phase period is terminated, and the P-phase period is initiated, the processing target pixel 300 is reset. At the time of the resetting, a pulse as the reset signal VD is output from the row scan circuit 130 to the drain connection point DCNT, that is, the drain corresponding to a row of the processing target pixel 300. Accordingly, in the processing target pixel 300, the electric charge accumulated in the photodiode PD is discharged into the drain of the transistor TR, and the reset level is output to the column signal line. The CDS circuit 210 initiates counting from a predetermined timing in the P-phase period, and stops the counting when a magnitude relationship between the pixel signal VSL and the reference signal VREF having a ramp waveform is reversed. The resulting count value corresponds to the reset level.

The CDS circuit 210 subtracts the count value obtained in the P-phase period from the count value obtained in the D-phase period. Although the pixel signal VSL in the D-phase period is a level corresponding to the received light, it also contains an offset component as a reset level, and the reset level contains a variation component and the like depending on a deviation in each pixel. Therefore, the value obtained as a result of the subtraction indicates a pixel signal level corresponding to the accurate received light amount from which the offset component is removed. The resulting value is output as the pixel signal data DVSL. As such, the image sensor 100 according to the embodiment of the present disclosure is configured to convert the electric charge accumulated in the pixel 300 as light is received into the digital image signal and output the digital image signal.

[Exemplary Pixel Structure]

Figure 4A:
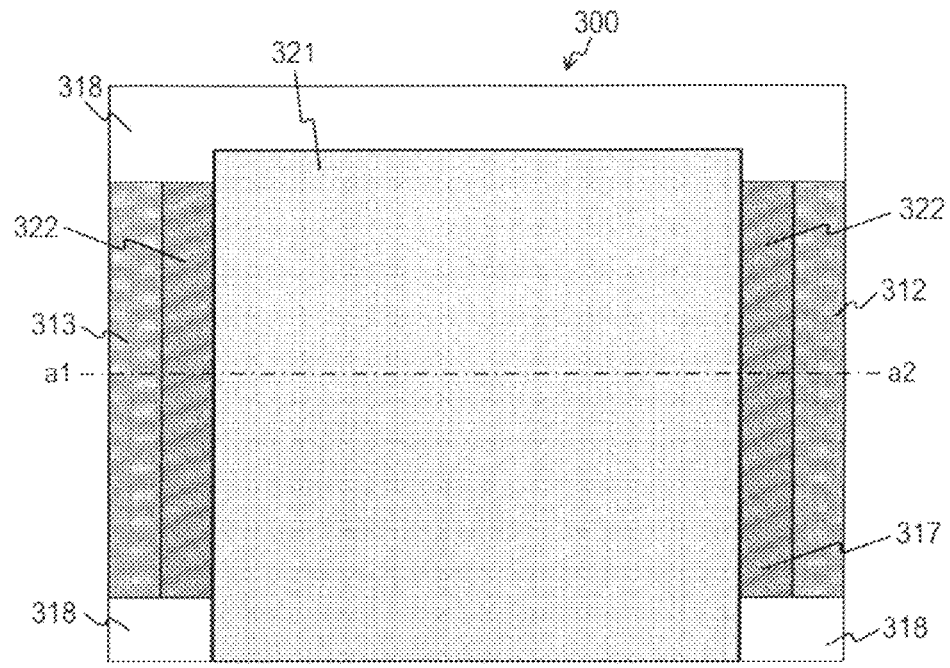
FIGS. 4A and 4B are diagrams illustrating an exemplary structure of a pixel according to an embodiment of the present disclosure.
Figure 4B:
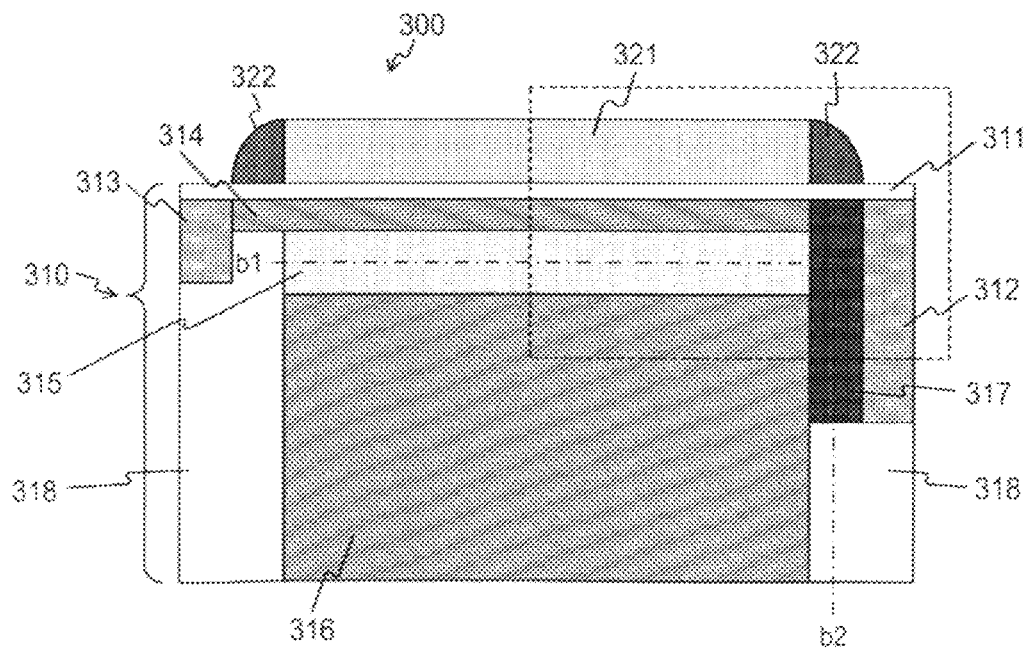

FIGS. 4A and 4B illustrate a detailed structural example of the pixel 300. FIG. 4A is a plan view illustrating a pixel 300. FIG. 4B is a cross-sectional view taken along the line a1-a2 of FIG. 4A, and schematically illustrates an exemplary structure of the impurity diffusion layer formed in the pixel 300. In the pixel 300 of FIGS. 4A and 4B, a structure corresponding to a single pixel 300 is selectively illustrated from the structure of the solid-state imaging device as the image sensor 100 of FIG. 2. In the plan view of FIG. 4A, in order to clarify a positional relationship between the formation portion of the semiconductor substrate 310 side and the gate electrode 321, the gate insulation film 311 is transparently drawn to show a lower portion thereof. As apparent from the following description, a direction of the line a1-a2 corresponds to the direction to which an electric current flows between the source 313 and the drain 312 through a channel 314. In this regard, the direction of the line a1-a2 is referred to as a source-drain direction.

The pixel 300 shown in FIGS. 4A and 4B includes a semiconductor substrate 310 made of silicon and a gate electrode 321 formed thereon. In the semiconductor substrate 310, a predetermined impurity diffusion layer and the like constituting the pixel 300 are formed in appropriate positions as described below. A sidewall portion 322 is arranged in the edge portion of the gate electrode 321 in the side where the drain 312 and the source 313 are arranged. The sidewall portion 322 is provided to set the border between the side faces of the overflow barrier 317 and the drain 312 in the process of manufacturing the pixel 300 described below through self-alignment.

A layer of the channel 314 is formed under the gate insulation film 311. An inter-channel-sensor barrier 315 is formed under the layer of the channel 314. The inter-channel-sensor barrier 315 is a barrier for preventing leakage of the electric changes between the channel 314 and the photoelectric conversion portion 316. The source 313 and the drain 312 are formed in both sides of the gate electrode 321 in the source-drain direction. The overflow barrier 317 is formed in the same planar position as that of the sidewall portion 322 of the inner side of the drain 312. The isolation barrier 318 is formed in the outer edge of the pixel 300 as shown in the drawing. The isolation barrier 318 is also referred to as a well, and serves as a barrier for preventing leakage of electrons between the neighboring pixels 300.

The photoelectric conversion portion 316 is a portion for accumulating electric charges corresponding to the incident light and is formed in a portion surrounded by the isolation barrier 318, the overflow barrier 317, and the inter-channel-sensor barrier 315.

As such, the pixel 300 of FIGS. 4A and 4B has a structure corresponding to an equivalent circuit to the CMD of FIG. 1. That is, the source 313, the channel 314, the drain 312, the gate insulation film 311, and the gate electrode 321 constitute a portion corresponding to the transistor TR of FIG. 1. In the structure of such a transistor TR, the electric current between the drain 312 and the source 313 flows in parallel with the surface of the semiconductor substrate 310 through the channel 314. The photoelectric conversion portion 316 corresponds to the photodiode PD of FIG. 1.

Figure 5:
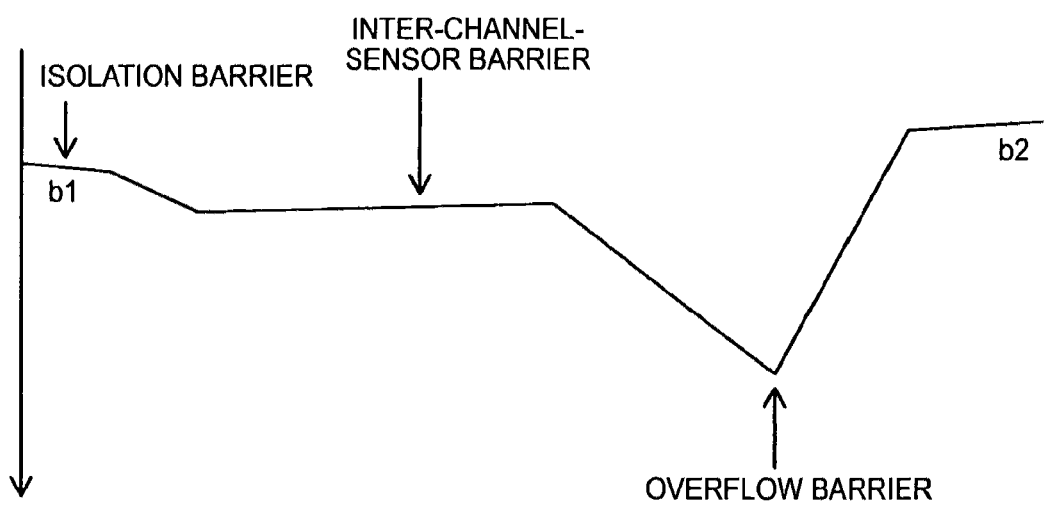
FIG. 5 is a diagram illustrating a potential in a barrier portion in the pixel.

In the structure of FIGS. 4A and 4B, the drain 312 also serves as the overflow drain. That is, excessive electric charges accumulated in the photoelectric conversion portion 316 are discharged to the drain 312 over the overflow barrier 317. FIG. 5 illustrates a diagram illustrating an electric potential in each barrier portion indicated by the dashed line b1-b2 of FIG. 4B. As shown in FIG. 5, out of the isolation barrier 318, the inter-channel-sensor barrier 315, and the overflow barrier 317, the overflow barrier 317 has a deepest potential, and thus, electric charges are accumulated in the overflow barrier 317. When the accumulation amount is equal to or greater than a certain value, excessive electric charges are discharged to the drain 312 side. In the structure of FIGS. 4A and 4B, the drain 312 as the overflow drain is arranged along the source-drain direction side by side in a lateral direction with respect to the photoelectric conversion portion 316 and the overflow barrier 317. In this structure, the overflow drain may also be referred to as a lateral overflow drain.

In the pixel 300 as the CMD, as described above, the accumulated electric charges are reset when the P-phase period is initiated, and at the time of resetting, a reset signal VD is applied to the drain 312 using a pulse having a predetermined voltage value. By applying the reset signal VD, the overflow barrier 317 is eliminated, and the electric charges accumulated in the photoelectric conversion portion 316 are discharged to the drain 312. The overflow barrier 317 is further reduced as the voltage value of the reset signal VD increases. Therefore, a voltage value necessary to eliminate the overflow barrier 317 is set as the reset signal VD. From that reason, in the related art, it was necessary to set a voltage value of the reset signal VD higher than other transistor driving voltages such as a gate voltage (row selection signal VG). However, in consideration of power consumptions, the reset signal VD is preferably set as low as possible.

In this regard, according to the embodiment of the present disclosure, as shown in FIGS. 4A and 4B, the overflow barrier 317 is formed in an area except for a position facing the gate electrode 321 in a planar direction. Specifically, the overflow barrier 317 is arranged under the sidewall portion 322 formed in an end of the gate electrode 321. Although the reason thereof will be described below, it is possible to lower the voltage value of the reset signal VD by setting the positional relationship between the gate electrode 321 and the overflow barrier 317 in this manner. As a result, it is possible to reduce power consumptions. Here, the planar direction refers to a two-dimensional position on the plane parallel to the surface of the gate electrode 321. Therefore, as viewed from a direction perpendicular to the surface of the gate electrode 321, the overflow barrier 317 and the gate electrode 321 are arranged in different areas.

In a case where a higher voltage value such as a gate voltage is set as the reset signal VD in the related art, it is necessary to separately install a power circuit for the reset signal VD. In comparison, according to the embodiment of the present disclosure, since the voltage value of the reset signal VD can be lowered, it is possible to set the voltage value of the reset signal VD to the same value as the gate voltage and the like. As a result, it is possible to use the same power circuit for the gate voltage or the like and for the reset signal VD, and reduce the circuit size.

[Exemplary Process of Manufacturing Pixel]

Next, a process of manufacturing the pixel 300 of FIGS. 4A and 4B will be described with reference to FIGS. 6A to 8B. The pixel 300 shown in FIGS. 6A to 8B corresponds to a portion surrounded by a dashed line in FIG. 4B. Here, out of the process of manufacturing the pixel 300, a process relating to the portion surrounded by the dashed line in FIG. 4B will be described. That is, description will be made for a process of setting a positional relationship between the gate electrode 321 and the overflow barrier 317, and a process of accurately defining a positional relationship between the gate electrode 321, the overflow barrier 317, and the drain 312 through self-alignment.

Figure 6A:
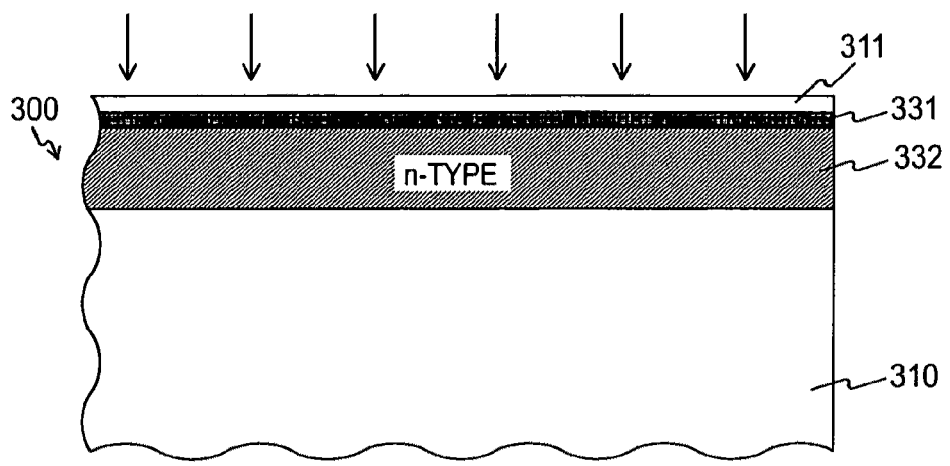
FIGS. 6A to 6C are diagrams illustrating an exemplary sequence of a manufacturing process of the pixel according to an embodiment of the present disclosure.

First, as shown in FIG. 6A, a gate insulation film 311 is formed on the surface of the semiconductor substrate 310. For this reason, a surface oxidation film made of a silicon oxide film is formed through a thermal oxidation technique, and a silicon nitride film and a silicon oxide film are sequentially stacked through deposition such as a chemical vapor deposition (CVD) technique.

Then, a p-type layer 331 is formed by performing ion plantation of boron ions ($B^+$) to the semiconductor substrate 310 by interposing the gate insulation film 311, and an n-type layer 332 is formed by performing ion implantation of arsenic ions ($As^+$). The n-type layer 332 is an example of the first impurity diffusion layer according to the embodiment of the present disclosure.

Figure 6B:
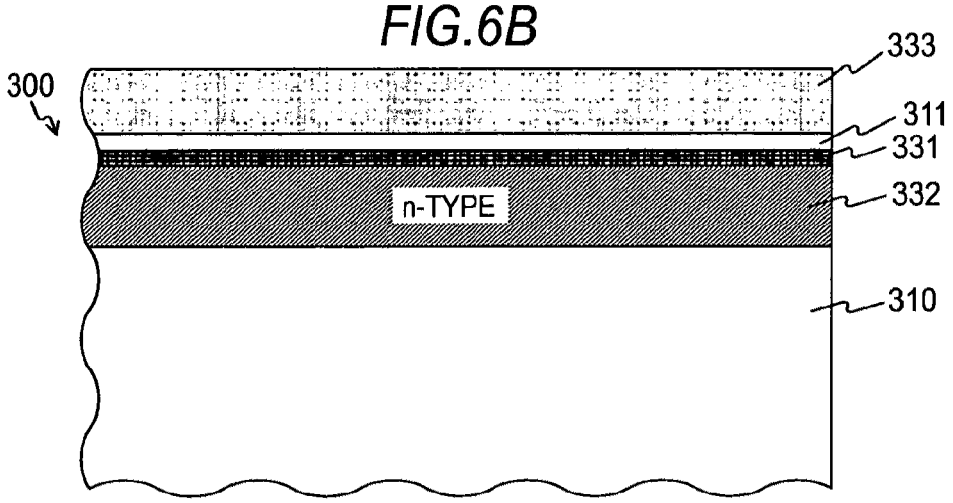
Figure 6C:
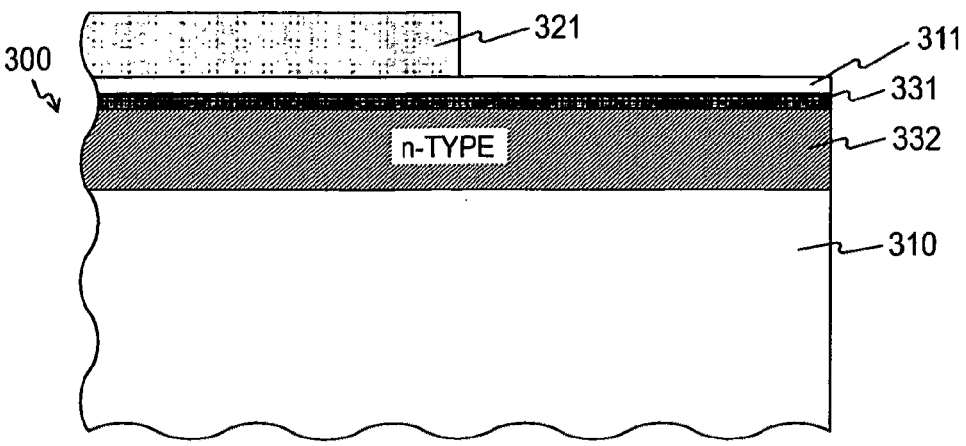

Then, as shown in FIG. 6B, an electrode material layer 333 made of, for example, poly-silicon is formed on the upper surface of the gate insulation film 311 through deposition. Then, a gate electrode 321 is formed by performing photolithography for the electrode material layer 333 as shown in FIG. 6C.

Figure 7A:
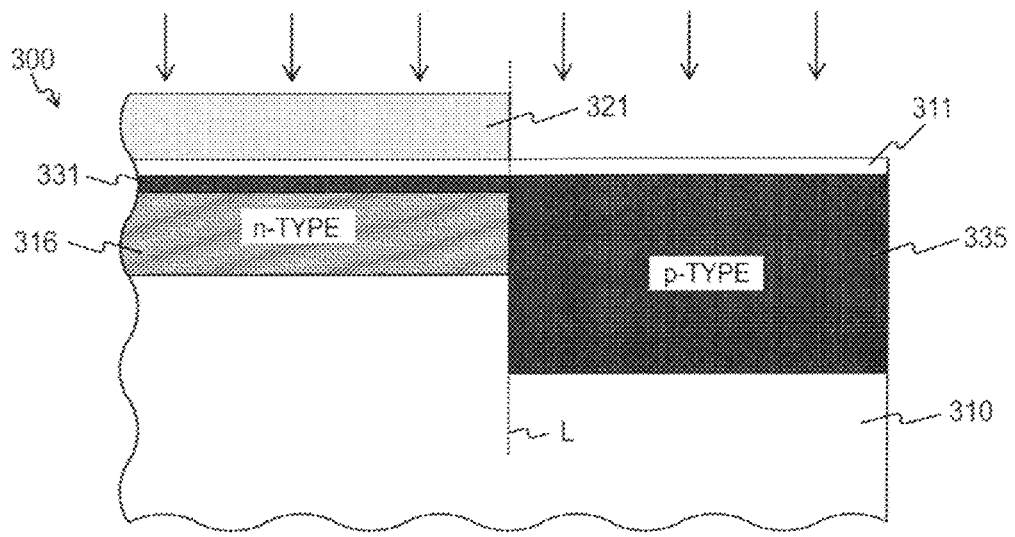
FIGS. 7A and 7B are diagrams illustrating an exemplary sequence of a manufacturing process of the pixel according to an embodiment of the present disclosure.

Then, as shown in FIG. 7A, a p-type layer 335 is formed through ion plantation. Ions implanted in this case do not transmit through the gate electrode 321. For this reason, the p-type layer 335 is formed such that the n-type layer 332 underlying the gate electrode 321 remains, and the n-type layer 332 in the portions that do not underlie the gate electrode 321 is eliminated. A part of the n-type layer 332 that underlies the gate electrode 321 and remains without being eliminated corresponds to the photoelectric conversion portion 316. In addition, the p-type layer 331 overlying the photoelectric conversion portion 316 serves as the inter-channel-sensor barrier 315 as shown in FIG. 4B. Furthermore, the p-type layer 335 corresponds to an example of the second impurity diffusion layer according to the embodiment of the present disclosure.

The p-type layer 335 is formed through self-alignment with respect to the edge of the gate electrode 321. As a result, as indicated by the dotted line L in FIG. 7A, a border position where each side face of the p-type layer 335, the p-type layer 331, and the photoelectric conversion portion 316 adjoin each other matches the position of the end of the gate electrode 321. That is, the border position is set with high precision with respect to the position of the gate electrode 321.

Figure 7B:
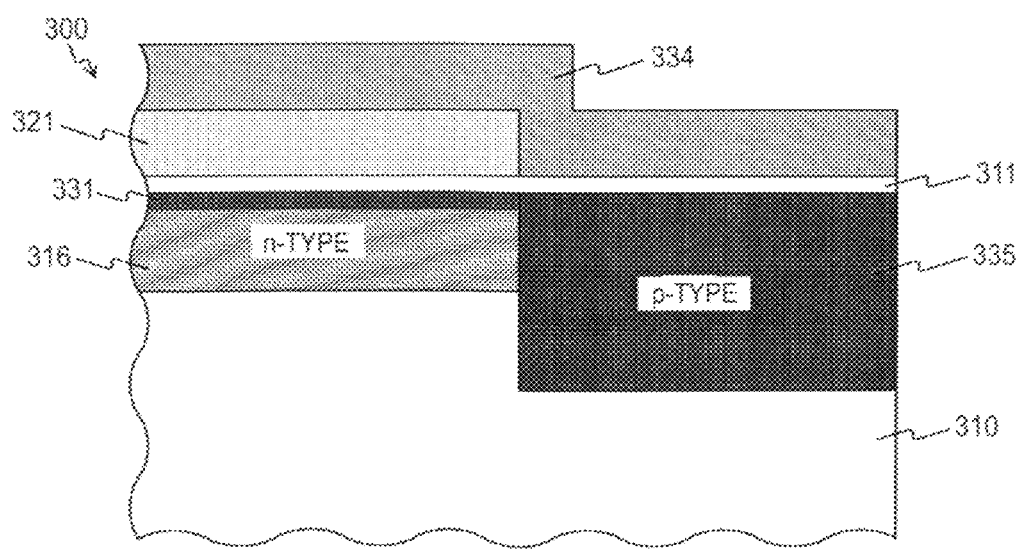
Figure 8A:
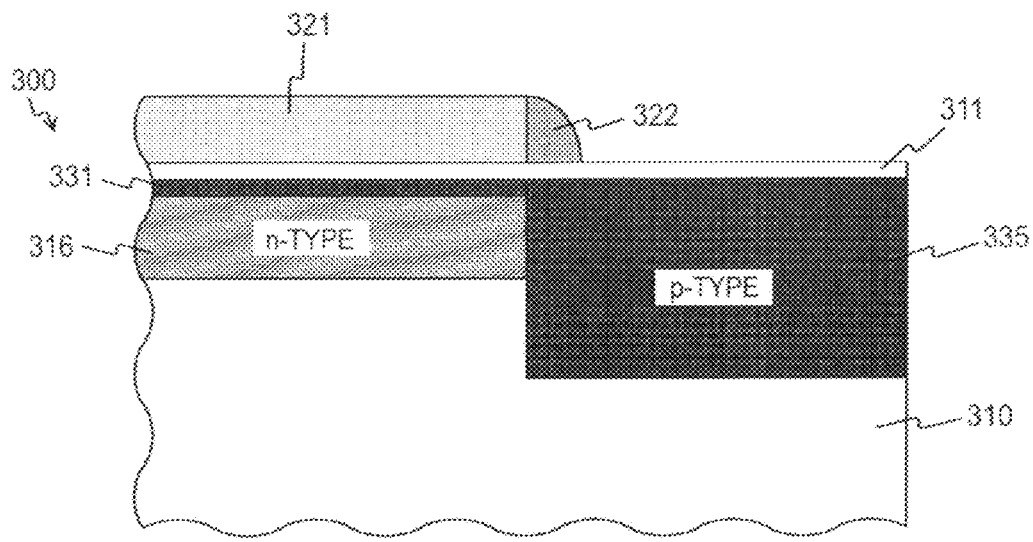
FIGS. 8A and 8B are diagrams illustrating an exemplary sequence of a manufacturing process of the pixel according to an embodiment of the present disclosure.

Then, as shown in FIG. 7B, a sidewall material layer 334 is formed on the entire surface of the semiconductor substrate 310 where the gate electrode 321 has been formed through deposition. Then, the sidewall material layer 334 is removed through an etch-back process as shown in FIG. 8A. As a result of the etch-back process, a portion of the sidewall material layer 334 making contact with the side face of the gate electrode 321 remains without being removed. Thus, a portion of the sidewall material layer 334 remaining without being removed corresponds to the sidewall portion 322.

Figure 8B:
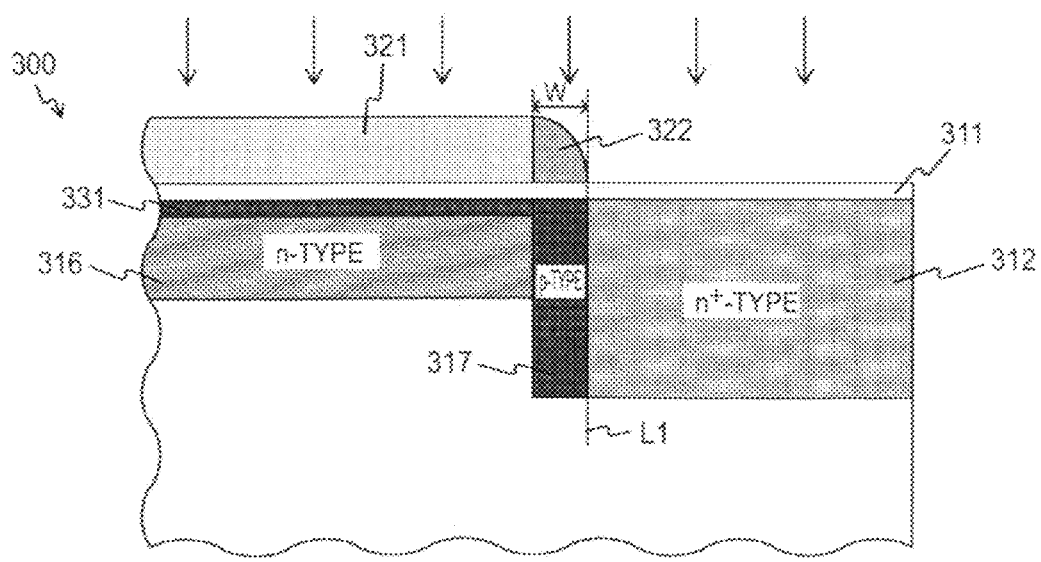

In addition, the width W in the source-drain direction of the sidewall portion 322 as shown in FIGS. 8A and 8B can be adjusted with relatively higher precision during the etch-back process. The width W of the sidewall portion 322 defines the width of the overflow barrier 317 in the source-drain direction as described below. For this reason, according to the embodiment of the present disclosure, the width W of the sidewall portion 322 is necessarily set such that the p-type layer serves most effectively as the overflow barrier 317.

Then, as shown in FIG. 8B, ion implantation is performed in a high concentration. The sidewall material layer 334 blocks the implanted ions without transmitting them. As a result, an $n^+$-type layer is formed to eliminate the p-type layer 335 in the outer side of the position of the end of the sidewall portion 322. The n⁺-type layer formed in this manner corresponds to the drain 312. In addition, while a portion of the p-type layer 335 remaining without being eliminated is formed under the sidewall portion 322, this portion corresponds to the overflow barrier 317. The border position adjoining the side face of the drain 312 and the side face of the overflow barrier 317 facing the drain 312 is defined through self-alignment with respect to the end of the sidewall portion 322 as indicated by the dotted line L1. The n⁺-type layer as the drain 312 corresponds to an example of the third impurity diffusion layer according to the embodiment of the present disclosure.

The channel 314 of FIG. 4B is formed in the border adjoining the gate insulation film 311 in the p-type layer 331 in comparison with FIG. 8B.

Similar to the drain 312, the source 313 of FIG. 4B is formed by ion plantation through self-alignment with respect to the end of the sidewall portion 332 in the source side. The source 313 is made of a n⁺-type layer similar to the drain.

As apparent from the aforementioned description, the position of the overflow barrier 317 is defined through self-alignment with respect to the gate electrode 321 and the sidewall portion 322. The drain 312 is also formed such that the border with the overflow barrier 317 is defined through self-alignment as described above. That is, according to the embodiment of the present disclosure, since the overflow barrier 317 and the drain 312 are formed through self-alignment, it is possible to obtain high precision without a deviation in the formation position thereof. As a result, for example, a deviation such as a saturated charge amount or a reset value can be reduced in each pixel 300 forming the image sensor 100.

In the aforementioned process, the p-type layer 335 serving as a source of the overflow barrier 317 is formed through self-alignment with respect to the gate electrode 321. Furthermore, the overflow barrier 317 and the drain 312 are formed through self-alignment with respect to the sidewall portion 322 formed in the end of the gate electrode 321. As a result, the overflow barrier 317 is formed under the sidewall portion 322 in a planar direction. Through the process according to the embodiment of the present disclosure shown in FIGS. 6A to 8B, the overflow barrier 317 can be formed through self-alignment in the position not facing the gate electrode 321 in the planar direction.

The sidewall portion 322 serves as a reference for forming the drain 312 and the overflow barrier 317 in self-alignment as shown in FIG. 8B, and does not have other function. For this reason, after the process of FIG. 8B, a process of removing the sidewall portion 322 may be added. However, even when the sidewall portion 322 remains as it is, no problem occurs in the size or the operation of the image sensor. In this regard, in order to reduce the number of processes according to the embodiment of the present disclosure, it is assumed that the process of removing the sidewall portion 322 is not performed.

[Description of Reset Voltage]

As described above, the gate electrode 321 and the overflow barrier 317 are positioned not to face each other. As a result, as described below, it is possible to lower the value of the pulse voltage to be output as a reset signal VD. In this context, the pulse voltage as the reset signal VD will be referred to as a reset voltage.

Here, as a comparison of the embodiment of the present disclosure, it is assumed that the pixel manufactured according to the manufacturing process in the related art disclosed in JP-A-2006-228762 is applied to the CMD. The pixel of the CMD manufactured in this manner has an arrangement structure of the impurity diffusion layer similar to the CCD disclosed in JP-A-2006-228762. In addition, the gate electrode 321, the gate insulation film 311, the photoelectric conversion portion 316, the overflow barrier 317, and the drain 312 correspond to the portions of the CCD disclosed in JP-A-2006-228762 as follows. Specifically, the gate electrode 321 is formed in the position of the transmission electrode. The gate insulation film 311 is formed as an insulation film under the transmission electrode. The photoelectric conversion portion 316 is formed in the position of the transmission CCD n-type layer formed under the transmission electrode. The drain 312 is formed in the position of the photosensor n-type layer arranged in the lateral side of the transmission CCD n-type layer. The overflow barrier 317 is formed in the position of the charge reading portion between the transmission CCD n-type layer and the photosensor n-type layer. In the pixel structure of the CMD of the manufacturing process of the related art, the overflow barrier 317 is arranged in a position facing the gate electrode 321 in a planar direction.

The reset voltage is applied to the drain 312 as described above, and such voltage application eliminates the overflow barrier 317. How much the overflow barrier 317 is eliminated depending on the voltage applied to the drain 312 can be indicated by a modulation degree. Here, the modulation degree represents a degree of change of the target point depending on a fixed electric potential applied to a particular portion. According to the embodiment of the present disclosure, the fixed electric potential applied to a particular portion corresponds to the reset voltage applied to the drain 312, and the target point corresponds to the overflow barrier 317.

The modulation degree can be obtained using a coupling capacitance between the target point and a portion to which a fixed electric potential is applied in the surroundings. Specifically, the modulation degree from the drain 312 to the overflow barrier 317 can be obtained as follows.

Figure 9:
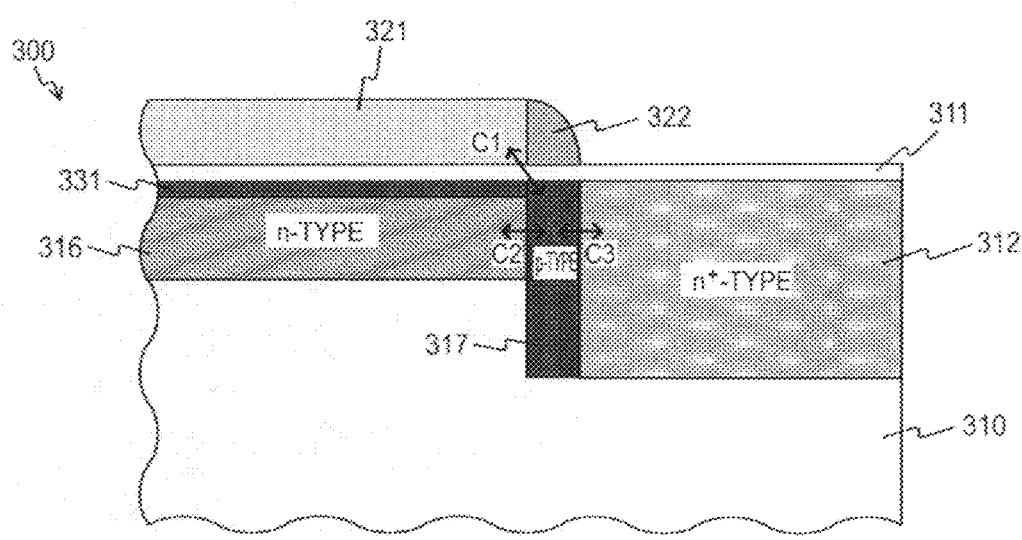
FIG. 9 is a diagram schematically illustrating a coupling capacitance generated between an overflow barrier, a gate electrode, a photoelectric conversion portion, and a drain.

FIG. 9 illustrates a structure of the pixel 300 similar to FIG. 8B. In FIG. 9, the portion to which a fixed electric potential is applied in the surroundings of the overflow barrier 317 corresponding to the target point includes the gate electrode 321, the photoelectric conversion portion 316, and the drain 312. Here, C1 denotes a coupling capacitance between the gate electrode 321 and the overflow barrier 317. In addition, C2 denotes a coupling capacitance between the photoelectric conversion portion 316 and the overflow barrier 317. In addition, C3 denotes a coupling capacitance between the drain 312 and the overflow barrier 317. The modulation degree G from the drain 312 to the overflow barrier 317 can be obtained based on the following equation.

$$G = C3/(C1+C2+C3)$$

That is, the modulation degree G can be obtained as a ratio of the capacitances obtained by connecting in parallel the coupling capacitance between the drain 312 and the overflow barrier 317 and overall coupling capacitances obtained by using the overflow barrier 317 as a target point.

If the reset voltage applied to the drain 312 has the same condition, the overflow barrier 317 is apt to change as the modulation degree G increases. That is, it is apt to be eliminated. This means that the overflow barrier 317 can be eliminated using a low reset voltage as the modulation degree G increases.

In the aforementioned equation, the modulation degree G increases as any one of the denominators, that is, either the coupling capacitance C1 or C2 is reduced. In this regard, the embodiment of the present disclosure focuses on the coupling capacitance C1 between the gate electrode 321 and the overflow barrier 317, so that the modulation degree G increases by reducing the coupling capacitance C1 in comparison with the related art.

That is, in the pixel of the CMD using a manufacturing process of the related art, the overflow barrier 317 is arranged to face the gate electrode 321. This is because the manufacturing process of the related art has been designed originally to manufacture the CCD, and it is necessary to apply a voltage to the charge reading portion formed in the position of the overflow barrier 317 due to the transmission electrode formed in the position of the gate electrode 321. In this case, the charge reading portion arranged under the transmission electrode, and the facing area of both sides is advantageously set as large as possible. However, in the case of the CMD having such a structure, a facing area between the gate electrode 321 and the overflow barrier 317 is set to be large, and the coupling capacitance C1 between the gate electrode 321 and the overflow barrier 317 also increases. For this reason, the modulation degree G is reduced.

However, in the case of a CMD type pixel, since the area of the charge reading portion corresponds to the overflow barrier 317, it is not necessary to apply a voltage from the gate electrode 321 to the overflow barrier 317. In this regard, according to the embodiment of the present disclosure, the overflow barrier 317 is formed in the position where the gate electrode 321 is not arranged in a planar direction. The positional relationship may be established such that the facing area between the gate electrode 321 and the overflow barrier 317 is reduced to nearly zero, and the coupling capacitance C1 is set to a significantly small value. As a result, the modulation degree G of the pixel 300 according to the embodiment of the present disclosure is greater than that of the CMD type pixel manufactured using a process of the related art. In addition, it is possible to set a reset voltage to a lower value in comparison with the related art.

Specifically, it is assumed that the coupling capacitances C1, C2, and C3 of the CMD type pixel manufactured using a process of the related art are set as follows:

$C1=4.0$ fF, $C2=0.5$ fF, and $C3=0.5$ fF.

In this case, the modulation degree G becomes 0.1.

In comparison, it is assumed that the coupling capacitances C1, C2, and C3 of the pixel 300 according to the embodiment of the present disclosure are set as follows:

$C1=1.0$ fF, $C2=0.5$ fF, and $C3=0.5$ fF.

That is, comparing to the CMD type pixel manufactured using a process of the related art, the coupling capacitances C2 and C3 are the same, but the coupling capacitance C1 is reduced to 1.0 fF due to a difference of the positional relationship between the gate electrode 321 and the overflow barrier 317. In this case, the modulation degree G becomes 0.2, which is double of that of the CMD type pixel manufactured using a process of the related art. By way of example, in the CMD type pixel manufactured using a process of the related art, a reset voltage of 3 V is necessary. However, according to the embodiment of the present disclosure, a reset voltage may be set to 1.5 V, which is a half of that of the related art.

As such, according to the embodiment of the present disclosure, it is possible to lower the reset voltage by forming the overflow barrier 317 not to face the gate electrode 321 thereunder. In addition, since the drain 312 serving as the overflow barrier 317 and the overflow drain is formed through self-alignment, for example, a variation of the characteristics in each pixel 300 of the image sensor is reduced, and miniaturization is not hindered.

In the manufacturing process of the related art, it is necessary to form the charge reading portion in a position within a range where the transmission electrode is arranged in a planar direction. For this reason, unlike the manufacturing process according to the embodiment of the present disclosure, it is difficult to form the charge reading portion through self-alignment with respect to the transmission electrode. Because of this fact, in the manufacturing process of the related art, it is necessary to form the cover layer before the transmission electrode is formed, and set the border between the transmission CCD n-type layer and the charge reading portion by performing self-alignment with respect to the cover layer. In comparison, the overflow barrier 317 according to the embodiment of the present disclosure is arranged in a position deviated from the gate electrode 321 in a planar direction. Therefore, it is possible to form the overflow barrier 317 through self-alignment with respect to the gate electrode 321 without forming the cover layer and reduce the number of processes.

2. Modification

[Application to Types Other than CMD]

In the aforementioned description, it has been assumed that the pixel 300 is a CMD type. However, the embodiments of the present disclosure may be applied to types other than the CMD if the pixel is structured such that the overflow barrier and the drain (overflow drain) are formed in the lateral direction. Specifically, as a modification of the solid-state imaging device according to the embodiment of the present disclosure, a pixel structure other than the CMD may be envisaged, in which the overflow barrier is formed not to face the gate electrode in a planar direction. Details of the structure in the pixel 300 may be appropriately changed.

It should be understood by those skilled in the art that embodiments of the present disclosure are just exemplary to implement the present disclosure, and as apparent from the description, elements described in the embodiments of the present disclosure correspond to specific elements in the appended claims. Similarly, specific elements in the appended claims correspond to similarly named elements in the embodiments of the present disclosure. Embodiments are not intended to limit the present disclosure, but various modifications, combinations, sub-combinations and alterations may occur without departing from the spirit and scope of the appended claims or the equivalents thereof.

The present disclosure contains subject matter related to that disclosed in Japanese Priority Patent Application JP 2010-269176 filed in the Japan Patent Office on Dec. 2, 2010, the entire content of which is hereby incorporated by reference.

What is claimed is:

1. A solid-state imaging device comprising:
   a gate electrode arranged over an upper surface of a semiconductor substrate;
   a photoelectric conversion portion of a first conduction type is formed in the semiconductor substrate to position under the gate electrode;

an inter-channel-sensor barrier of a second conduction type is formed in the semiconductor substrate over the photoelectric conversion portion and positioned under the gate electrode;

an overflow barrier of the second conduction type is formed in the semiconductor substrate to position outside a periphery of the gate electrode and adjoins a side face of the photoelectric conversion portion and the inter-channel-sensor barrier, respectively; and a drain of the first conduction type is formed in the semiconductor substrate to adjoin a side face of the overflow barrier opposite to a side face adjoining the photoelectric conversion portion.

2. The solid-state imaging device according to claim 1, wherein a position of a border where the photoelectric conversion portion and the overflow barrier adjoin each other matches a position of an end of the gate electrode.

3. The solid-state imaging device according to claim 1, further comprising a sidewall portion arranged to adjoin an end of the gate electrode in a drain side, wherein a position of a border where the overflow barrier and the drain adjoin each other matches a position of an end of the sidewall portion.

4. The solid-state imaging device according to claim 3, wherein the sidewall portion is a part of a sidewall material layer remaining without being removed when a process of removing the sidewall material layer formed on a front surface of the semiconductor substrate where the gate electrode is arranged is performed.

5. The solid-state imaging device according to claim 4, wherein a width of the sidewall portion extending from an end adjoining the gate electrode to an opposite end is set when the process of removing the sidewall material layer is performed.

6. A method of manufacturing a solid-state imaging device comprising:

forming a first impurity diffusion layer corresponding to a photoelectric conversion portion by performing ion implantation to a semiconductor substrate;

forming a second impurity diffusion layer corresponding to an inter-channel-sensor barrier by performing ion plantation to the semiconductor substrate;

forming a gate electrode on a portion of an upper surface of the semiconductor substrate;

forming the second impurity diffusion layer corresponding to an overflow barrier by performing ion plantation on the upper surface of the semiconductor substrate;

forming a sidewall material layer on the entire upper surface of the semiconductor substrate and the gate electrode where;

forming a side wall portion from a part of the sidewall material layer remaining without being removed in an end of the gate electrode when a process of removing the sidewall material layer from the semiconductor substrate is performed; and forming a third impurity diffusion layer corresponding to a drain by performing ion implantation on the upper surface of the semiconductor substrate, wherein the overflow barrier of a second conduction type is formed in the semiconductor substrate to position outside a periphery of the gate electrode and adjoins a side face of the photoelectric conversion portion and the inter-channel-sensor barrier, respectively.

7. The method of manufacturing a solid-state imaging device according to claim 6, wherein a position of a border where the photoelectric conversion portion and the overflow barrier adjoin each other matches a position of an end of the gate electrode.

8. The method of manufacturing a solid-state imaging device according to claim 6, wherein the sidewall portion adjoins an end of the gate electrode in a drain side, wherein a position of a border where the overflow barrier and the drain adjoin each other matches a position of an end of the sidewall portion.

9. The method of manufacturing a solid-state imaging device according to claim 6, wherein the third impurity diffusion layer is formed in the semiconductor substrate to adjoin a side face of the overflow barrier opposite to a side face adjoining the photoelectric conversion portion.

10. The method of manufacturing a solid-state imaging device according to claim 6, wherein the second impurity diffusion layer is formed through self-alignment with respect to the edge of the gate electrode and the sidewall portion.

11. The method of manufacturing a solid-state imaging device according to claim 6, wherein the third impurity diffusion layer is formed through self-alignment with respect to the edge of the sidewall portion.

12. The solid-state imaging device according to claim 1, wherein the first conduction type and the second conduction type are n-type and p-type, respectively.

13. The solid-state imaging device according to claim 1, wherein the photoelectric conversion portion accumulates electric charge by receiving light.

14. The solid-state imaging device according to claim 13, wherein the accumulated electric charge is discharged to the drain by applying a predetermined reset voltage to the drain.

15. The solid-state imaging device according to claim 1, further comprising a source formed in the semiconductor substrate, wherein the source is at a side opposite to the side face of the photoelectric conversion portion adjoined to the overflow barrier, wherein the source extends away from the side of the photoelectric conversion portion from a position matching to a border of the side wall portion which is not adjoined to the gate electrode.

16. The solid-state imaging device according to claim 1, wherein the overflow barrier is arranged under a sidewall portion formed at a drain side end of the gate electrode.

17. A solid-state imaging device comprising:

a gate electrode arranged over an upper surface of a semiconductor substrate;

a photoelectric conversion portion formed in the semiconductor substrate to position under the gate electrode;

an overflow barrier formed in the semiconductor substrate to position in a portion other than a position facing the gate electrode in a planar direction and adjoins a side face of the photoelectric conversion portion;

a drain formed in the semiconductor substrate to adjoin a side face of the overflow barrier opposite to a side face adjoining the photoelectric conversion portion; and a sidewall portion arranged to adjoin an end of the gate electrode in a drain side, wherein a position of a border where the overflow barrier and the drain adjoin each other matches a position of an end of the sidewall portion.

18. The solid-state imaging device according to claim 17, wherein a position of a border where the photoelectric conversion portion and the overflow barrier adjoin each other matches a position of an end of the gate electrode.

19. The solid-state imaging device according to claim 18, wherein the sidewall portion is a part of a sidewall material layer remaining without being removed when a process is performed for removing the sidewall material layer formed on the gate electrode.

20. The solid-state imaging device according to claim 19, wherein a width of the sidewall portion extending from an end adjoining the gate electrode to an opposite end is set when the process of removing the sidewall material layer is performed.

* * * * *